(12) United States Patent
Kim et al.

(10) Patent No.: US 7,408,411 B2
(45) Date of Patent: Aug. 5, 2008

(54) HIGH LINEARITY PROGRAMMABLE GAIN AMPLIFIER USING SWITCH

(75) Inventors: Tae Wook Kim, Gyeonggi-do (KR); Bonkee Kim, Gyeonggi-do (KR); Kwyro Lee, Daejeon (KR)

(73) Assignee: Integrant Technologies Inc., Gyeonggi-do (KR)

( * ) Notice: Subject to any disclaimer, the term of this patent is extended or adjusted under 35 U.S.C. 154(b) by 182 days.

(21) Appl. No.: 11/201,429

(22) Filed: Aug. 11, 2005

(65) Prior Publication Data
US 2006/0033574 A1 Feb. 16, 2006

(30) Foreign Application Priority Data
Aug. 12, 2004 (KR) .................. 10-2004-0063440
Oct. 29, 2004 (KR) .................. 10-2004-0087472

(51) Int. Cl.
*H03G 3/00* (2006.01)
(52) U.S. Cl. ............... 330/284; 330/124 R; 330/51
(58) Field of Classification Search ........... 330/284, 330/124 R, 51
See application file for complete search history.

(56) References Cited

U.S. PATENT DOCUMENTS

| 5,285,169 A * | 2/1994 | Theus .................. 330/254 |
| 6,175,279 B1 * | 1/2001 | Ciccarelli et al. ........ 330/296 |
| 6,208,202 B1 * | 3/2001 | Kaufman et al. .......... 330/51 |
| 6,278,325 B1 | 8/2001 | Juang |
| 6,292,052 B1 * | 9/2001 | Carlson .................. 330/9 |
| 6,657,491 B2 * | 12/2003 | Fanous et al. .......... 330/124 R |
| 7,098,738 B2 * | 8/2006 | Tam et al. ............... 330/284 |

* cited by examiner

*Primary Examiner*—Patricia Nguyen
(74) *Attorney, Agent, or Firm*—Foley & Lardner

(57) ABSTRACT

Disclosed is a high linearity programmable gain amplifier using a switch, including an attenuating portion for controlling a gain of a signal and an amplifying portion having a first amplifying part and a second amplifying part, for amplifying an input signal and outputting a signal amplified, wherein the first amplifying part has a first amplifier for amplifying an input signal and a first switch for activating the first amplifier and the second amplifying part has a second amplifier for amplifying an input signal and a second switch for activating the second amplifier.

6 Claims, 4 Drawing Sheets

HIGH LINEARITY PROGRAMMABLE GAIN AMPLIFIER USING SWITCH

This Nonprovisional application claims priority under 35 U.S.C. § 119(a) on Patent Application Nos. 10-2004-0063440 filed in Korea on Aug. 12, 2004 and 10-2004-0087472 filed in Korea on Oct. 29, 2004, the entire contents of which are hereby incorporated by reference.

BACKGROUND OF THE INVENTION

1. Field of the Invention

The present invention relates to a gain amplifier, more particularly, to a high linearity programmable gain amplifier using a switch.

2. Description of the Background Art

FIG. 1 shows a circuit diagram of a discrete step gain switch amplifier (DSGSA) using a prior art switch.

As shown in FIG. 1, a conventional amplifier using a switch consists of an attenuating portion 110 and an amplifying portion 120.

The attenuating portion 110 includes an input terminal RFin, a plurality of switches SW11 to SW14, and a plurality of resistors R11 to R16.

The amplifying portion 120 is composed of an amplifier 121, resistors RF1 and RF2, and an output terminal RFout.

The output terminal of the attenuating portion 110 is connected with the input terminal of the amplifying portion 120.

When all of switches SW11 to SW14 in the attenuating portion 110 are opened, even if an input signal is applied to the attenuating portion 110, no signal is to be amplified by the amplifying portion 120 because any circuit cannot be formed.

Meanwhile, when the switch SW11 of the attenuating portion 110 is closed to form the circuit, an input signal is applied to a first input terminal of the amplifying portion 120, and a signal attenuated by the attenuating portion 110 based on a combined resistance value of resistors R11 to R16 is applied to a second input terminal of the amplifying portion 120.

The turn-on or turn-off of switches SW11 to SW14 may alter the gain of the amplifier 121.

If the attenuating portion 110 exists in the first and second input terminals of the amplifying portion 120, when an amplifying operation in the amplifier 121 is performed in a low gain, the effect of the noise figure from the amplifier 121 is minimal, but, when the amplifying or converting operation in the amplifier 121 is performed in a high gain, the noise due to the switching noise from a switching element or a thermal noise in the amplifier 121, etc, can be added to an original signal, thereby deteriorating the noise figure.

FIG. 2 shows a circuit diagram of a variable gain low noise amplifier constructed by a parallel connection of prior art amplifier.

As shown, the variable gain low noise amplifier has a first selective portion to a fourth selective portion 201, 202, 203 and 204, a power supply and an input/output terminal.

The first selective portion 201 comprises a driving part including resistors R21 and R22, a capacitor C11 and a transistor M11, and further comprises a capacitor C12 and a transistor M12.

The second selective portion 202 comprises a driving part including resistors R23 and R24, a capacitor C21 and a transistor M21 and an amplifying part including capacitors C12 and C23 and a transistor M22.

The third selective portion 203 comprises a driving part including resistors R25 and R26, a capacitor C31 and a transistor M31 and an amplifying part including capacitors C32 and C33 and a transistor M32.

The fourth selective portion 204 comprises a driving part including resistors R27 and R28, a capacitor C41 and a transistor M41 and an amplifying part including capacitors C42 and C43 and a transistor M42.

The operation of the variable gain low noise amplifier will be described below in detail.

If a current I1 is applied to a base of the transistor M12 to select the first selective portion 201, a current between an emitter and a base of the transistor M12 is amplified rapidly and thereby conducting the transistor M12. This also leads the conduction of the transistor M11. As a result, a gain is determined by the capacitor C12.

If a current I2 flows into a base of the transistor M22, the transistor M22 is conducted and conduction of the transistor M22 also leads to conduction of the transistor M21. As a result, a gain is determined by the capacitance ratio of the capacitor C22 to the capacitor C23.

The third selective portion 203 and the fourth selective portion 204 operate in similar manner with the first selective portion 201 and the second selective portion 202.

In conclusion, the transistor M12 does not attenuate a signal, but the transistors M22, M32 and M42 attenuate a signal with gains determined by the capacitance ratio of the capacitor C22 to the capacitor C23, the capacitance ratio of the capacitor C32 to the capacitor C33 and the capacitance ratio of the capacitor 42 to the capacitor C43, respectively.

Accordingly, the total gain of the whole amplifier circuit is changed depending on which selective portion among the selective portions 201 to 204 is selected.

That is, a desired gain of the amplifier circuit is achieved by connecting the selective portions 201 to 204 in parallel and selecting any one of the selective portions 201 to 204.

However, the conventional variable gain low noise amplifier is disadvantageous in that the parallel connection of the amplifying parts, i.e. the selective portions, and application of the electric current to select any one amplifying part among the amplifying parts lead to deterioration of the characteristics of the circuit in view of the bandwidth, and further the application of an electric current to the amplifying parts increases the total power consumption.

SUMMARY OF THE INVENTION

Accordingly, it is an object of the present invention to solve at least the problems and disadvantages of the background art and thereby provide a variable gain amplifier capable of not deteriorating noise figure and ensuring the sufficient bandwidth.

Another object of the present invention is to provide a variable gain amplifier consuming low power.

Still another object of the present invention is to provide a variable gain amplifier having a high linearity of amplifier gain.

To accomplish the objects above, according to one aspect of the present invention, there is provided a high linearity programmable gain amplifier using a switch, including an attenuating portion for controlling a gain, and an amplifying portion including a first amplifying part and a second amplifying part for amplifying an input signal and outputting a signal amplified, wherein the first amplifying part has a first amplifier for amplifying an input signal and a first switch for activating the first amplifier and the second amplifying part has a second amplifier for amplifying an input signal and a second switch for activating the second amplifier.

The attenuating portion may include a switch and a resistive divider.

The first and second switches may operate complementally to each other.

When the first switch of the attenuating portion is turned on, the first switch of the first amplifying part may be turned off and the second switch of the second amplifying part may be turned on.

The first switch may be connected to an output terminal of the first amplifier and the second switch may be connected to an output terminal of the second amplifier.

The attenuating portion includes a plurality of attenuating parts connected in parallel.

The attenuating parts are separately formed in different wells, respectively.

In accordance with another aspect of the present invention, there is provided a high linearity programmable gain amplifier using a switch, including a follower circuit portion for transmitting a voltage without phase change, the follower circuit including a first transistor with first through third terminals and a first biasing portion applying a bias voltage; and a switch portion for controlling a gain of a signal transmitted from the follower circuit by switching operation and generating an output signal, wherein the switch portion includes a second transistor having first through third terminals, the first terminal being connected to a power supply voltage, the second terminal being connected to a switch which controls a gain by switching a signal and is supplied with the same voltage as the bias voltage applied to the follower circuit portion, and the third terminal being connected to a second biasing portion which applies a bias voltage, and wherein all the third terminals of the first and second transistors are coupled to each other to form an output terminal.

A gain of the circuit is determined to meet the following expression which is a relational expression between a width function of the transistor of the follower circuit portion and a width function of the transistor of the switch portion, $$A_V = \frac{g_{m1}}{g_{m1} + g_{m2}} = \frac{kW_1}{kW_1 + kW_2} = \frac{W_1}{W_1 + W_2}$$

where W1 is a width function of the first transistor, W2 is a width function of the second transistor, k is a proportional constant, gm1 is an output impedance of the follower circuit, and gm2 is an output impedance of the switch portion.

In accordance with further another aspect of the present invention, there is provided a high linearity programmable gain amplifier including: a follower circuit portion for transmitting a voltage without phase change, the follower circuit including a first transistor with first through third terminals and a first biasing portion applying a bias voltage; and a first switch portion and a second switch portion for controlling a gain of a signal transmitted from the follower circuit by a first switching operation and a second switching operation and generating an output signal, wherein the first switch portion includes a second transistor having first through third terminals, the first terminal being connected to a power supply voltage, the second terminal being connected to a switch which controls a gain of a signal by switching the signal and is supplied with the same voltage as the bias voltage applied to the follower circuit portion, and the third terminal being connected to a second biasing portion which applies a bias voltage; and the second switch portion includes a third transistor having first through third terminals, the first terminal being connected to a power supply voltage, the second terminal being connected to a switch which controls a gain by switching a signal and is supplied with the same voltage as the bias voltage applied to the follower circuit portion, and the third terminal being connected to a third biasing portion which applies a bias voltage, and wherein the third terminals of the first through third transistors are coupled to each other to form an output terminal.

Here, the first through third biasing portions are constituted by fourth through sixth transistors, respectively, each with first through third terminals, wherein the second terminals of the fourth through sixth transistors are coupled to form an input terminal for receiving a constant-current source there through.

Here, a switch is provided before an input stage, such as a gate, of the fifth and sixth transistors, respectively.

The first through third biasing portions are realized by a shared bias unit which comprises a fourth transistor with a first terminal, a second terminal connected to a constant-current source, and a third terminal.

Each transistor above is implemented by a metal oxide semiconductor field effect transistor (MOSFET) or a bipolar junction transistor (BJT).

The gain control of the circuit is performed to meet the following expression:

$$\frac{\Delta dB(A_V)}{\Delta W} = \frac{\log\left(\frac{W_1}{W_1 + W_{n+1}}\right) - \log\left(\frac{W_1}{W_1 + W_n}\right)}{(W_1 + W_{n+1}) - (W_1 + W_n)}$$

$$= \frac{\log\left(\frac{W_1 + W_n}{W_1 + W_{n+1}}\right)}{W_{n+1} - W_n}$$

$$= \frac{\log\left(1 + \frac{W_n - W_{n+1}}{W_1 + W_{n+1}}\right)}{W_{n+1} - W_n}$$

$$= \frac{\log\left(1 + \frac{-\Delta W}{W_1 + W_{n+1}}\right)}{\Delta W} \% \frac{\frac{-\Delta W}{W_1}}{\Delta W} \% - \frac{1}{W_1}$$

where ΔdB is a value corresponding to gain change, ΔW is a value corresponding to width function value change, W1 is a width function of the first transistor, Wn is a width function of a transistor belongs to n-th switch portion, and Wn+1 is a width function of a transistor belongs to n+1-th switch portion.

BRIEF DESCRIPTION OF THE DRAWINGS

The invention will be described in detail with reference to the following drawings in which like numerals refer to like elements.

DETAILED DESCRIPTION OF PREFERRED EMBODIMENTS

Figure 1:
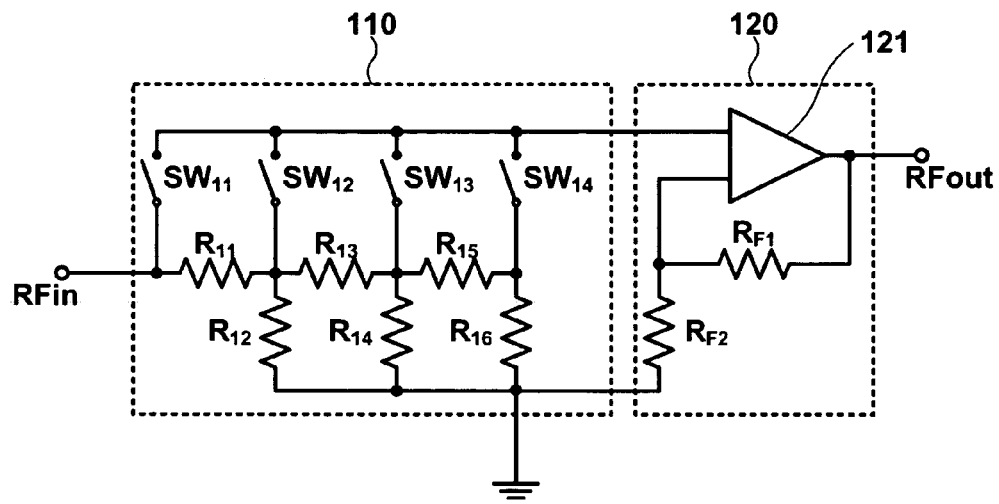
FIG. 1 is a circuit diagram of a conventional discrete-step gain switch amplifier using a switch.
Figure 2:
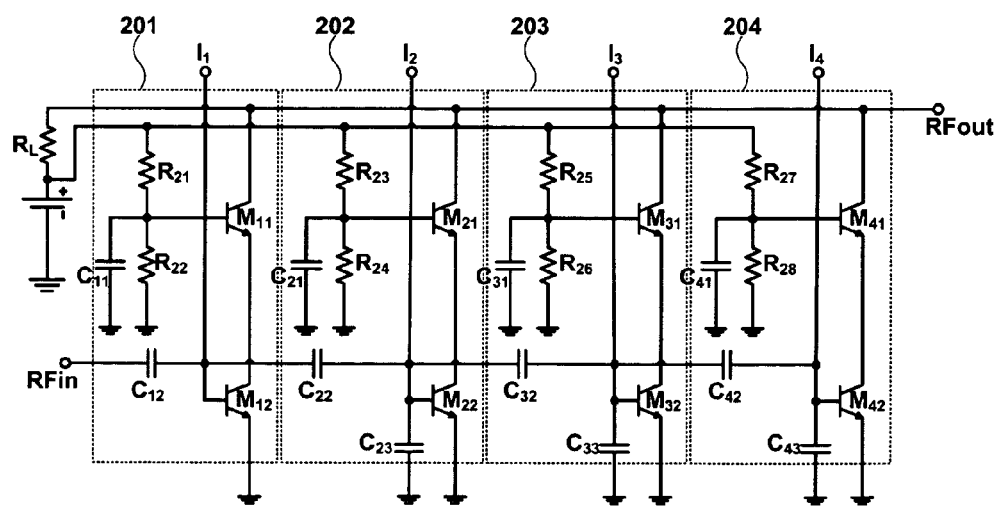
FIG. 2 is a circuit diagram of a conventional variable gain low noise amplifier including amplifiers connected in parallel with each other.

Certain embodiments of the present invention will be described in greater detail with reference to the accompanying drawings.

In the following description, same drawing reference numerals are used for the same elements even in different drawings. The matters defined in the description such as a detailed construction and elements are nothing but the ones provided to assist in a comprehensive understanding of the invention. Thus, it is apparent that the present invention can be carried out without those defined matters. Also, well-known functions or constructions are not described in detail since they would obscure the invention in unnecessary detail.

Preferred embodiments of the present invention will be described in a more detailed manner below.

Figure 3:
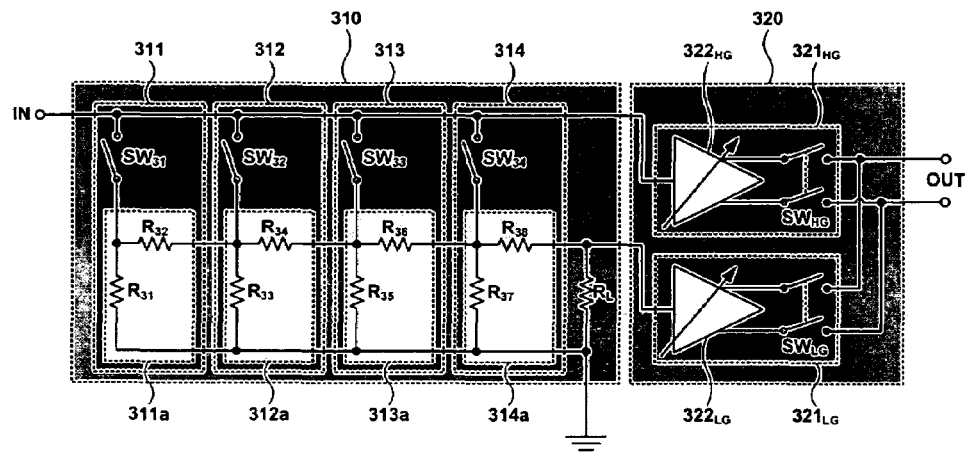
FIG. 3 is a circuit diagram of a high linearity programmable gain amplifier using a switch according to the first embodiment of the present invention.

FIG. 3 is a circuit diagram of a high linearity programmable gain amplifier using a switch according to a first embodiment of the present invention.

Referring to FIG. 3, a high linearity programmable gain amplifier using a switch includes an attenuating portion 310 and an amplifying portion 320.

<Configuration>

The attenuating portion 310 includes a first attenuating part 311, a second attenuating part 312, a third attenuating part 313 and a fourth attenuating part 314.

Here, the first attenuating part 311 includes a first switch SW31 and a first resistive divider 311a, the second attenuating part 312 includes a second switch SW32 and a second resistive divider 312a, the third attenuator member 313 includes a third switch SW33 and a third resistive divider 313a, and the fourth attenuator member 314 includes a fourth switch SW34 and a fourth resistive divider 314a.

The amplifying portion 320 includes a first amplifying part 321HG and a second amplifying part 321LG.

Here, the first amplifying part 321HG includes a first amplifier 322HG and a first amplifying switch SWHG, and the second amplifying part 321LG includes a second amplifier 322LG and a second amplifying switch SWLG.

<Connection>

The first switch SW31 has one terminal connected to an input terminal IN of the whole amplifier circuit and the other terminal connected to an end of the first resistive divider 311a.

The first resistive divider 311a includes a first resistor R31 and a second resistor R32 connected in parallel.

The second switch SW32 has one terminal connected to the input terminal IN of the whole amplifier circuit and the other terminal connected to one end of a second resistive divider 312a.

The second resistive divider 312a includes a third resistor R33 and a fourth resistor R34 connected in parallel.

The third switch SW33 has one terminal connected to the input terminal IN of the whole amplifier circuit and the other terminal connected to one end of the third resistive divider 313a.

The third resistive divider 313a includes a fifth resistor R35 and a sixth resistor R36 connected in parallel.

The fourth switch SW34 has one terminal connected to the input terminal IN of the whole amplifier circuit and the other terminal connected to one end of the fourth resistive divider 314a.

The fourth resistive divider 314a includes a seventh resistor R37 and an eighth resistor R38 connected in parallel.

An input terminal of the first amplifier 322HG is connected to the input terminal IN of the whole amplifier circuit, thereby forming an input terminal of the first amplifying part 321HG. Meanwhile an output terminal of the first amplifier 322HG is connected to one terminal of the first amplifying switch which has the other terminal connected to an output terminal OUT.

The second amplifier 322LG has an input terminal connected to an output terminal of the fourth resistive divider 314a to form an input terminal of the second amplifying part 321LG and an output terminal connected to one terminal of the second amplifying switch SWLG which has the other terminal connected to an output terminal OUT.

<Operation>

When all the first to fourth switches in the first to fourth attenuating parts 311 to 314 are turned off, an input signal inputted to the input terminal IN can not be applied to the input terminal of the second amplifying part 321LG. As a result, the second amplifying part 321LG does not operate and output a signal but only the first amplifying part 321HG operates to output an amplified signal to the output terminal OUT.

That is, in order to control the amplifying operation of the second amplifying part 321LG in programmable, any one of the first to fourth switches should be turn on but the first amplifier switch SWHG should be turned off.

Or, oppositely, the second switch SWLG is turned off as well as all the first to fourth switches SW31 to SW34 are turned off.

Accordingly, negative effect with respect to the noise figure caused due to the switching is ignorable even though the amplifier circuit operates with high gain.

Here, when any one of the first to fourth switch SW31 to SW34 is turned on while other others are turned off, the first amplifying switch SWHG of the first amplifying part 321HG is turned off. Thus, the first amplifying part 321HG stops to operate while the second amplifying part 321LG starts to operate as the second amplifying switch SWLG is turned on.

Here, the first amplifying part 321HG and the second amplifying part 321LG do not generate an output signal at the identical time but alternatively generate an output signal.

Thus, in accordance with the first embodiment of the present invention, it is possible to programmably control gains of a signal when it is required to achieve a low gain by using the first to fourth attenuating parts 311 to 314 or it is possible to achieve a high gain by bypassing the first to the attenuating parts 311 to 314.

In the description above, the attenuating portion is configured to comprise four attenuating parts, but the number of attenuating parts in the attenuating portion can be variable. That is, the attenuating parts can be additionally added.

Also, the first to the fourth attenuating parts 311 to 314 may be separately formed in different wells by using a triple-well structure to prevent components of signals from leaking into a substrate even in case of high frequency signals.

Namely, the resistors R32 and R33 of the attenuating part 311 are formed in one well of the triple-well structure formed by a CMOS process, and the resistors R33 and R34 of the attenuating part 312 are formed in another well of the triple-well structure. Also, the remaining resistors R35, R36, R37 and R38 of the attenuators 313 and 314 also are formed in different wells from each other.

Therefore, in accordance with the first embodiment of the present invention, it is possible to programmably control gains of the amplifier circuit in case that the amplifier circuit operates with a low gain, and ensure excellent noise figure in case that the amplifier circuit operates with a high gain. The amplifier circuit in accordance with the first embodiment of the present invention further has advantages of wide bandwidth and low power consumption.

Figure 4:
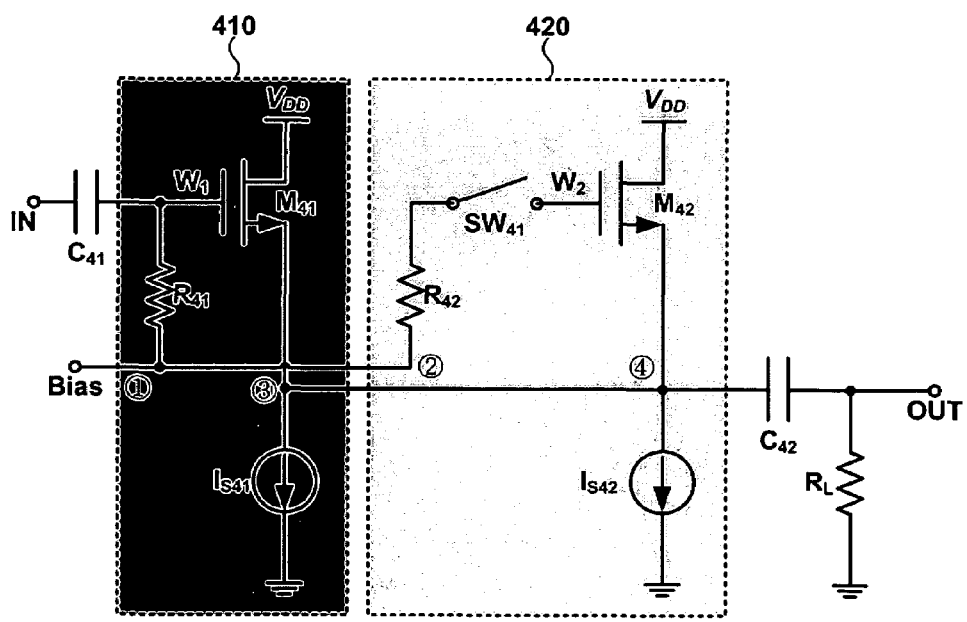
FIG. 4 is a circuit diagram of a high linearity programmable gain amplifier using a switch according to the secondary embodiment of the present invention.

FIG. 4 is a circuit diagram of a high linearity programmable gain amplifier using a switch according to a second embodiment of the present invention.

Referring to FIG. 4, a high linearity programmable gain amplifier using a switch comprises a source follower circuit 410 and a switching circuit 420.

<Construction>

The source follower circuit 410 includes a first resistor R41, a first transistor M41, and a first current source IS41.

The switching circuit 420 includes a second resistor R42, a first switch SW41, a second transistor M42, and a second current source IS42.

<Connection>

The input terminal IN is connected to one electrode of the first capacitor C41, and the other electrode of the capacitor C41 is connected to both one end of the first resistor R41 and a gate of the first transistor M41.

A bias voltage Bias is applied to both nodes ① and ②, in which the node ① is connected to the other end of the first resistor R41 and the node ② is connected to one end of the second resistor R42.

A source of the first transistor M41 is connected to a node ③ which is also an end of the first current source IS41.

The other end of the second resistor R42 is connected to one end of the first switch SW41, and the other end of the first switch SW41 is connected to a gate of the second transistor M42.

A source of the second transistor M42 is connected to a node ④ serving as one end of the second current source IS42.

Here, the node ③ and the node ④ are connected to each other, in which node ④ is connected to one electrode of the second capacitor C42, the other electrode of the second capacitor C42 is connected to one end of a load resistor RL and the output terminal OUT.

<Operation>

The channel width function W1 of the first transistor is determined when a circuit is constructed, and output impedance thereof becomes 1/gm1.

In the source follower circuit 410, the input signal is applied to the other electrode of the first capacitor C41, the power voltage $V_{DD}$ is applied to the drain of the first transistor M41, and the current source IS41 is connected to the node ③, so that a source follower circuit is constructed.

Also, the channel width function of the second transistor M42 is determined depending on opening or closing the first switch SW41 in the switching circuit 420, so that the output impedance is expressed as 1/gm2.

According to such a construction, the amplifying degree can be changed based on the width function determined by the source follower circuit 410 and the switching circuit 420, and such a changed signal is output from one end of the load resistor RL.

That is, the programmable gain control amplifier can be implemented by using two source follower circuits, and linearity thereof will be described below.

As the input signal and the bias voltage Bias are applied to the first transistor M41 at the same time, a circuit having the output impedance of 1/gm1 can be constructed.

At this time, if only D.C bias voltage Bias is applied to the input terminal of the source follower circuit constructed and thereby turns on/off the first switch SW41, the channel width function W2 of the second transistor M42 is determined. Then, when the channel width function W2 is determined, the electric current flowing through the second transistor M42 increases by the ratio W1/W2, the ratio of the channel width function W1 of the first transistor M41 to the channel width function W2 of the second transistor M42.

Here, a gain can be expressed by the following Equation:

$$A_V = \frac{\frac{1}{g_{m2}} // R_L}{\frac{1}{g_{m2}} // R_L + \frac{1}{g_{m1}}}, \frac{1}{g_{m2}} JR_L \quad \text{[Equation 1]}$$

Where, since the output impedance 1/gm1 is smaller than RL in value, the gain in the Equation 1 can be expressed as the following Equation 2 based on the relationship between gm1 and gm2:

$$A_V = \frac{\frac{1}{g_{m2}}}{\frac{1}{g_{m1}} + \frac{1}{g_{m2}}} = \frac{g_{m1}}{g_{m1} + g_{m2}} \quad \text{[Equation 2]}$$

Thus, the gain is calculated based on the relationship between gm1 and gm2, in which gm is expressed as the following Equation 3:

$$g_m = \mu_n C_{ox} \frac{W}{L}(V_{GS} - V_{TH}), g_m] \, kW \quad \text{[Equation 3]}$$

From this, it is obvious that gm is proportional to the channel width function when the bias voltage is identical.

Thus, the gain control expression is expressed as the following Equation 4:

$$A_V = \frac{g_{m1}}{g_{m1} + g_{m2}} = \frac{kW_1}{kW_1 + kW_2} = \frac{W_1}{W_1 + W_2} \quad \text{[Equation 4]}$$

The channel width functions W1 and W2 of two transistors M41 and M42 constitute the control expression.

Thus, the turn-on/turn-off of the first switch SW41 which is coupled with the second transistor M42 can control the gain.

Equation 5 with reference to Equation 4 summarizes the gain control step.

$$\frac{\Delta dB(A_V)}{\Delta W} = \frac{\log\left(\frac{W_1}{W_1 + W_{n+1}}\right) - \log\left(\frac{W_1}{W_1 + W_n}\right)}{(W_1 + W_{n+1}) - (W_1 + W_n)}$$

$$= \frac{\log\left(\frac{W_1 + W_n}{W_1 + W_{n+1}}\right)}{W_{n+1} - W_n} \quad \text{[Equation 5]}$$

-continued $$= \frac{\log\left(1 + \frac{W_n - W_{n+1}}{W_1 + W_{n+1}}\right)}{W_{n+1} - W_n}$$

$$= \frac{\log\left(1 + \frac{-\Delta W}{W_1 + W_{n+1}}\right)}{\Delta W} \% \frac{-\Delta W}{\Delta W} \% - \frac{1}{W_1}$$

Here, it is obvious that, the gain is proportional to 1/W1 when ΔW is significantly small than W1.

The present invention is preferably applicable for a precision gain control circuit for controlling a small quantity of gain and exhibiting the linear characteristic in the bandwidth dB.

As described above, since the gain control depends on a channel width function, it exhibits the insensible characteristic with respect to a process, an environmental temperature, fluctuation of voltage, etc. Thus, it is possible for the amplifier circuit to ensure precision and stability in gain control. Also, since the channel width functions of transistors determines gain control function, the amplifier circuit can further additionally employ the transistors in multiple stages.

Figure 5:
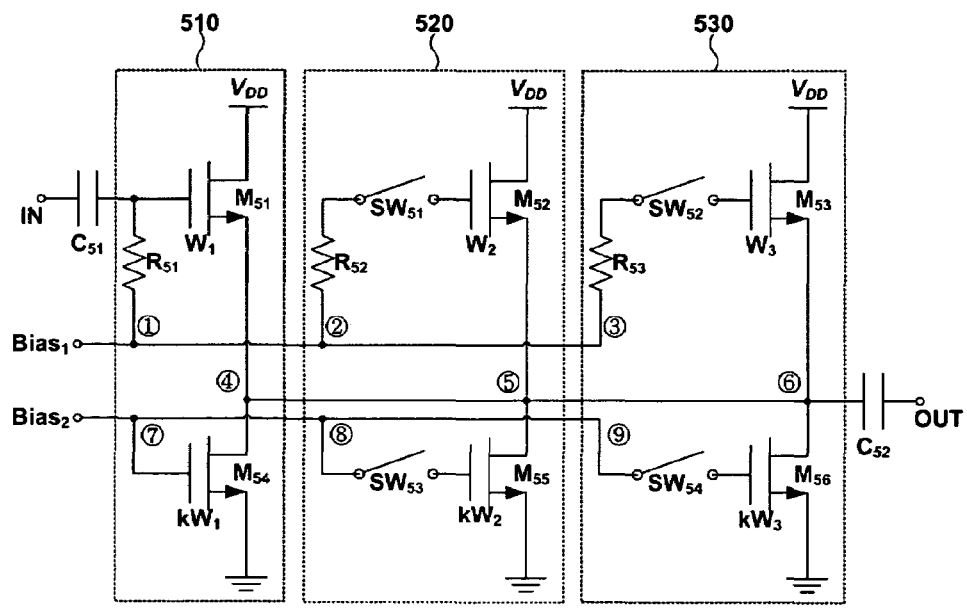
FIG. 5 is a circuit diagram of a high linearity programmable gain amplifier using a switch according to a first modified example of the second embodiment of the present invention.

FIG. 5 shows a high linearity programmable gain amplifier using a switch, which has a switching portion in accordance with one example of the second embodiment of the present invention.

Referring to FIG. 5, a high linearity programmable gain amplifier using a switch includes a source follower circuit 510, a first switching circuit 520 and a second switching circuit 530.

<Construction>

The source follower circuit 510 has a first resistor R51, a first transistor M51 and a fourth transistor M54.

The first switching circuit 520 has a second resistor R52, a first switch SW51, a second transistor M52, a third switch SW53, and a fifth transistor M55.

The second switching circuit 530 has a third resistor R53, a second switch SW52, a third transistor M53, a fourth switch SW54, and a sixth transistor M56.

<Connection>

One electrode of the first capacitor C51 is connected to a gate of first transistor M51 and one end of first resistor R51.

The other end of first resistor R51 is connected to a node ①.

A source of the first transistor M51 is connected to a node ④.

One end of the second resistor R52 is connected to a node ②, and the other end of the second resistor R52 is connected to one terminal of first switch SW51.

The other terminal of the first switch SW51 is connected to the gate of second transistor M52.

A source of the second transistor M52 is connected to a node ⑤.

One end of the third resistor R53 is connected to a node ③, and the other end of the third resistor R53 is connected to one terminal of the second switch SW52.

The other end of the second switch SW52 is connected to the gate of third transistor M53.

A source of third transistor M53 is connected to a node ⑥.

Here, a first bias voltage Bias₁ is applied to the nodes ①, ② and ③.

The fourth transistor M54 has a gate connected to a node ⑦, a drain connected to a node ④, and a source connected to a ground.

The third switch SW53 is provided with one end terminal connected to a node ⑧, and the other terminal connected to a gate of the fifth transistor M55.

A drain of the fifth transistor M55 is connected to the node ⑤, and a source of the fifth transistor M55 is connected to a ground.

The one terminal of the fourth switch SW54 is connected to a node ⑨, and other terminal of fourth switch SW54 is connected to the gate of sixth transistor M56.

A drain of the sixth transistor M56 is connected to the node ⑥, and a source of sixth transistor M56 is connected to a ground.

Here, a second bias voltage Bias₂ is applied to the nodes ⑦, ⑧ and ⑨.

And, the node ⑥ is connected to one electrode of the second capacitor C52, and the other electrode of second capacitor C52 serves as the output terminal OUT.

<Operation>

When an input signal is applied to an input terminal IN, the first capacitor C51 functions as a D.C. blocking element for blocking D.C. components of signals applied to the input terminal IN, a channel width function W1 of the first transistor M51 and a channel width function kW1 of the fourth transistor M54 are determined as soon as a circuit is constructed, a power voltage $V_{DD}$ is applied to a drain of the first transistor M51, an output from a source of the first transistor M51 is applied to a drain of the fourth transistor M54, and the first bias Bias₁ is applied to the node ①, and the second bias voltage Bias₂ is applied to the node ⑦, so that a source follower circuit 510 is constructed.

When the first switch SW51 and the third switch SW53 of the first switching circuit 520 are simultaneously opened or closed, a channel width function W2 of the second transistor M52 and a channel width function kW2 of the fifth transistor M55 are determined, a power voltage $V_{DD}$ is applied to a drain of the second transistor M52, an output from a source of the second transistor M52 is applied to a drain of the fifth transistor M52, and the second bias voltage Bias₂ is applied to the node ⑧, so that the first switching circuit 520 is constructed.

Here, the first switch SW51 and the third switch SW53 are simultaneously turned on or off to determine the amplifying operation, in which it has a linear characteristic as explained above.

When the second switch SW52 and the fourth switch SW54 in the second switching circuit 530 are simultaneously opened or closed, a channel width function W3 of the third transistor M5 and a channel width function kW3 of the sixth transistor M56 are determined, and a power voltage $V_{DD}$ is applied to a drain of the third transistor M53, the output of the source of the third transistor M53 is applied to a drain of the sixth transistor M56, the first bias voltage Bias₁ is applied to the node ③, the second bias voltage Bias₂ is applied to the node ⑨, so that the second switching circuit 530 is constructed, in which the first capacitor C52 connected to the node ⑥ acts as a D.C. blocking element for blocking D.C. components of signals to be output through the output terminal OUT.

Here, when the second switch SW52 and the fourth switch SW54 are simultaneously turned on or off to determine the amplifying operation That is, the first to fourth switches SW51 to SW54 are provided before the corresponding gates of the second transistor M52, the fifth transistor M55, the third transistor M53, and the sixth transistor M56, respectively, for switching to control gains and selectively drive the transistors M52, M53, M55 and M56.

As explained with reference to FIG. 4, since it is possible to control gains by the channel width functions of the firth to the sixth transistor M51 to M56, the transistors can be arranged in multiple stages.

Here, if it is required to additionally add transistors to the amplifier circuit for a gain control, a gain control circuit can be easily and simply constituted by adding the circuit 520 as many as it is required.

The gain control is performed in multiple steps using a plurality of gain control transistors, so that the number of transistors can be increased depending on the gain control characteristic.

Figure 6:
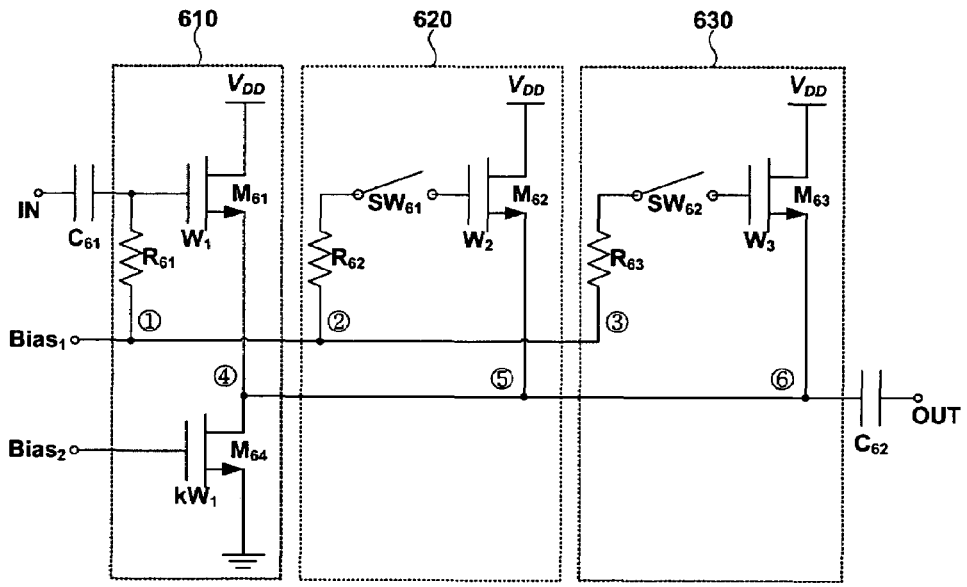
FIG. 6 is a circuit diagram of a high linearity programmable gain amplifier using a switch according to a second modified example of the second embodiment of the present invention, in which a switching portion is modified.

FIG. 6 is a circuit diagram of a high linearity programmable gain amplifier using a switch, which has a modified switching portion in accordance with a second example of the second embodiment of the present invention.

As shown in FIG. 6, a high linearity programmable gain amplifier using a switch includes a source follower circuit 610, a first switching circuit 620, and a second switching circuit 620.

<Construction>

The source follower circuit 610 has a first resistor R61, a first transistor M61 and a fourth transistor M64.

The first switching circuit 620 has a second resistor R62, a first switch SW61, and a second transistor M62.

The second switching circuit 630 has a third resistor R63, a second switch SW62 and a third transistor M63.

<Connection>

One electrode of the first capacitor C61 is connected to a gate of the first transistor M61 and one end of a first resistor R61.

The other end of the first resistor R61 is connected to a node ①.

A source of the first transistor M61 is connected to a node ④.

One end of the second resistor R62 is connected to a node ②, and the other end of the second resistor R62 is connected to one terminal of the first switch SW61.

The other terminal of the first switch SW61 is connected to a gate of the second transistor M62.

A source of the second transistor M62 is connected to a node ⑤.

One end of the third resistor R63 is connected to a node ③, and the other end of the third resistor R63 is connected to one terminal of the second switch SW62.

The other terminal of the second switch SW62 is connected to a gate of the third transistor M63.

A source of the third transistor M63 is connected to a node ⑥.

Here, a first bias voltage $Bias_1$ is applied to the nodes ①, ② and ③.

The fourth transistor M64 has a gate to which the second bias voltage $Bias_2$ is applied, a drain connected to the node ④ and a source grounded.

Here, the nodes ④, ⑤ and ⑥ are connected commonly to one electrode of the second capacitor C62, and the other electrode of the second capacitor C62 acts an output terminal OUT.

<Operation>

When an input signal is applied to an input terminal IN, a channel width function W1 of the first transistor M61 and a channel width function kW1 of the fourth transistor M64 are determined as soon as an electrical circuit is constructed, a power voltage $V_{DD}$ is applied to a drain of the first transistor M61, an output from a source of the first transistor M61 is applied to a drain of the fourth transistor M64, a first bias voltage $Bias_1$ is applied to the node ①, and a second bias $Bias_2$ is applied to the gate of the fourth transistor M64, so that a source follower circuit 610 is constructed.

When the first switch SW61 in the first switching circuit 620 is opened or closed, a channel width function W2 of the second transistor M62 is determined, a power voltage $V_{DD}$ is applied to a drain of the second transistor M62, and a source of the second transistor M62 is connected to the node ⑤, so that the first switching circuit 620 is constructed.

Here, the first switch SW61 is turned on or turned off to determine the amplifying operation, in which the first switch SW61 has a linear characteristic as described.

When the second switch SW62 in the second switching circuit 630 is opened or closed, a channel width function W3 of the third transistor M63 is determined, and a power voltage $V_{DD}$ is applied to a drain of the third transistor M63, and a source of the third transistor M63 is connected to the node ⑥, so that the second switching circuit 630 is formed.

Here, the second switch SW62 is turned on or turned off to determine the amplifying operation and it has a linear characteristic as noted above.

The first and second switches SW61 and SW62 are disposed before the gates of the second transistor M62 and the third transistor M63, respectively, to drive the transistors M62 and M63 by being switched.

Thus, as described with reference to FIG. 4, in performing the gain control, the control is implemented by channel width functions W1 to W3 and Kw1 of the first to fourth transistors, so that the gain control can be preformed in multiple steps.

Here, in case that it is necessary to additionally add transistors for the gain control, a gain control circuit for controlling the gain can be simply constituted by adding the circuits 620 as many as it is required to achieve a desired gain.

Also, in the description above, there is provided a plurality of transistors to control gains in multiple steps. Accordingly, the number of these transistors may be increased depending on the gain control characteristics.

Figure 7:
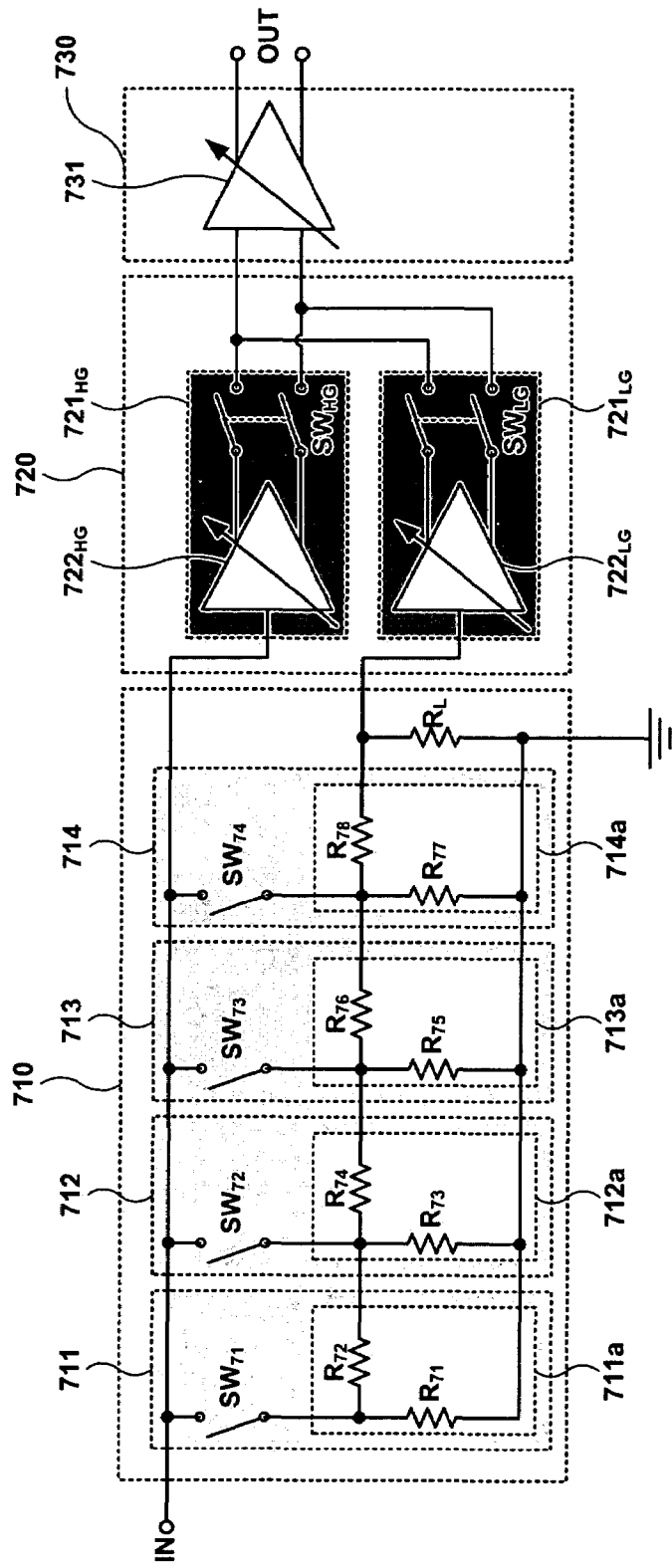
FIG. 7 is a circuit diagram of a high linearity programmable gain amplifier using a switch according to the third embodiment of the present invention.

FIG. 7 is a circuit diagram of a high linearity programmable gain amplifier using a switch according to a third embodiment of the present invention.

As shown in FIG. 7, a high linearity programmable gain amplifier using a switch includes an attenuating portion 710, an amplifying portion 720 and a linearity portion 730.

Since the attenuating portion 710 and the amplifying portion 720 were already described with reference to FIG. 3 and the linearity portion 730 was also described with reference to FIG. 4 to FIG. 6, only the systematic operation between these elements will be explained.

<Construction>

The attenuating portion 710 includes a first attenuating part 711, a second attenuating part 712, a third attenuating part 713, and a fourth attenuating part 714.

The amplifying portion 720 includes a first amplifying part 721HG and a second amplifying part 721LG.

The linearity portion 730 includes a linear amplifier element 771.

<Connection>

The output of the attenuating portion 710 is applied to the input terminal of the amplifying portion 720.

The output of the amplifying portion 720 is applied to the input terminal of the linearity portion 730.

<Operation>

A signal output from the amplifying portion 720 is applied to the input terminal of the linearity portion 730, and the linear amplifier element 771 of the amplifying portion 720 uses the high linearity programmable gain amplifier shown in FIG. 4 to FIG. 6 to enhance the linearity.

The linear amplifier element 771 has been described with reference to FIG. 4 to FIG. 6 already.

In the attenuating portion 710, a signal is attenuated by the first attenuating part 711, the second attenuating part 712, the third attenuating part 713 and the fourth attenuating part, and then the attenuated signal is selectively amplified by first amplifying part 721HG and the second amplifying part 721LG in the amplifying portion 720. Further in order to increase the linearity of the selectively amplified signal, the source follower circuit is utilized.

In conclusion, in accordance with the present invention, gains of the amplifier are programmably controlled over a wide range in case of low gains. Further, when the amplifier circuit operates with a high gain, it is possible to ensure excellent noise figure. Further, since the gain control is achieved by the channel width functions of the transistors in the linearity portion 730*n*, the gain control circuit in accordance with the present invention has the insensible characteristic with respect to a process, an environmental temperature, fluctuation of voltage, and et al. Thus, it is possible to ensure precision and stability of the control and. Also, since the gain is determined by the channel width function of a transistor, the gain control range can be easily expanded by increasing the number of transistors which are arranged in multiple stages, thereby ensuring wide bandwidth and high and excellent linearity The foregoing embodiment and advantages are merely exemplary and are not to be construed as limiting the present invention. The present teaching can be readily applied to other types of apparatuses. Also, the description of the embodiments of the present invention is intended to be illustrative, and not to limit the scope of the claims, and many alternatives, modifications, and variations will be apparent to those skilled in the art.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A high linearity programmable gain amplifier using a switch, comprising:
    an attenuating portion for controlling a gain; and
    an amplifying portion having a first amplifying part and a second amplifying part for amplifying an input signal and outputting an amplified signal,
    wherein the first amplifying part includes a first amplifier for amplifying an input signal and a first switch for activating the first amplifier, and the second amplifying part includes a second amplifier for amplifying an input signal and a second switch for activating the second amplifier, and
    wherein the attenuating parts are formed in different wells, respectively.

2. The high linearity programmable gain amplifier according to claim 1, wherein the attenuating portion includes attenuating parts each of which having a switch for controlling a gain and a resistive divider.

3. The high linearity programmable gain amplifier according to claim 2, wherein the first and second switches operate complementally to each other.

4. The high linearity programmable gain amplifier according to claim 2, wherein in case that more than one of the switches of the attenuating portion is(are) turned on, the first switch is turned off but the second switch is turned on.

5. The high linearity programmable gain amplifier according to claim 2, wherein the attenuating portion comprises a plurality of the attenuating parts connected in parallel.

6. The high linearity programmable gain amplifier according to claim 1, wherein the first switch is connected to an output terminal of the first amplifier and the second switch is connected to an output terminal of the second amplifier.

* * * * *